United States Patent [19]
Ueda et al.

[11] Patent Number: 5,891,774
[45] Date of Patent: Apr. 6, 1999

[54] METHOD OF FABRICATING EEPROM USING OBLIQUE IMPLANTATION

[75] Inventors: Naoki Ueda, Nara; Kenichi Tanaka, Fukuyama; Masaaki Tanaka, Sakai, all of Japan

[73] Assignee: Sharp Kabushiki Kaisha, Osaka, Japan

[21] Appl. No.: 707,076

[22] Filed: Sep. 3, 1996

[30] Foreign Application Priority Data

Nov. 17, 1995 [JP] Japan .................................. 7-300094

[51] Int. Cl.$^6$ .............................................. H01L 21/8247
[52] U.S. Cl. .......................... 438/264; 438/286; 438/302
[58] Field of Search .................................. 438/257, 264, 438/286, 302, 525, 545

[56] References Cited

U.S. PATENT DOCUMENTS

| | | | |
|---|---|---|---|
| 5,147,811 | 9/1992 | Sakagami | 438/302 |
| 5,190,887 | 3/1993 | Tang et al. | 438/264 |
| 5,316,961 | 5/1994 | Okazawa | 438/286 |
| 5,355,006 | 10/1994 | Iguchi | 438/302 |

FOREIGN PATENT DOCUMENTS

| | | |
|---|---|---|
| 4-329632A | 11/1992 | Japan . |
| 6-021476A | 1/1994 | Japan . |

*Primary Examiner*—Chandra Chaudhari
*Attorney, Agent, or Firm*—Nixon & Vanderhye, P.C.

[57] ABSTRACT

A semiconductor memory device is provided which comprises: a plurality of memory cell transistors each having a tunnel oxide film formed on a semiconductor substrate of a first conductivity type, a floating gate formed on the tunnel oxide film, a control gate overlaid on the floating gate with intervention of an insulating film, source/drain regions of a second conductivity type formed in the semiconductor substrate, and a high-concentration impurity layer of the first conductivity type formed in a portion adjacent to the drain region below the floating gate by oblique ion implantation employing an implantation angle θ with respect to a normal line to the semiconductor substrate; the plurality of memory cell transistors each sharing a source region with a memory cell transistor disposed adjacent thereto on one side thereof and a drain region with a memory cell transistor disposed adjacent thereto on the other side thereof; the implantation angle θ being defined by the following expression:

$0 < \tan^{-1}(Ld/Hg) < \theta < \tan^{-1}(Ls/Hg) < \pi/2$ wherein Ls is a distance between gates of the adjacent transistors sharing the source region, Ld is a distance between gates of the adjacent transistors sharing the drain region, and Hg is a total height of the floating gate, the insulating film and the control gate on the tunnel oxide film.

4 Claims, 6 Drawing Sheets

METHOD OF FABRICATING EEPROM USING OBLIQUE IMPLANTATION

BACKGROUND OF THE INVENTION

1. Field of the Invention

The present invention relates to a semiconductor memory device and a fabrication process therefor. More particularly, the invention relates to a semiconductor memory device including a NOR-type flash EEPROM in which the impurity concentration in a portion of a channel region adjacent to source/drain regions is different from that in the other portion of the channel region, and to a fabrication process therefor.

2. Description of Related Art

Flash EEPROMs of one-transistor-per-cell structure are conventionally used as nonvolatile memory devices which are capable of electrically writing and erasing data.

A memory cell transistor in such a flash EEPROM includes, as shown in FIG. 10, a floating gate 23 of a polysilicon film formed on a semiconductor substrate 21 with intervention of a gate insulating film 22, an ONO insulating film 24, and a control gate 27 comprised of a polysilicon film 25 and a tungsten silicide film 26 and also serving as a word line. Source/drain regions 28 and 29 are formed on opposite sides of the floating gate 23 and the control gate 27, and the source region 28 has a low-concentration impurity layer 28a in its peripheral portion.

A fabrication process for a memory cell transistor as described above will hereinafter be described.

As shown in FIG. 8, P-type ions are implanted into a device formation region of a P-type semiconductor substrate 21 having a device isolation film (not shown) to control the impurity concentration in a channel region, and then a silicon oxide film 22 is formed on the semiconductor substrate 21.

In turn, as shown in FIG. 9, a floating gate 23, an insulating film 24 and a control gate 27 comprised of a polysilicon film 25 and a tungsten silicide film 26 are formed on the resulting substrate. A resist pattern 30 having an opening only on a source formation region is formed on the resulting substrate by a photolithographic and etching process. Then, a low-concentration impurity layer 28a is formed by implanting N-type ions (N$^+$) in a low concentration into the resulting substrate with use of the floating gate 23, the control gate 27 and the resist pattern 30 as a mask.

Subsequently, the resist pattern 30 is removed, and N-type ions (N$^{++}$) are implanted in a high concentration into the resulting semiconductor substrate 21 including the floating gate 23 and the control gate 27 to form source/drain regions 28 and 29.

To write data to the memory cell transistor shown in FIG. 10, a high voltage of about 12 V is applied to the control gate with the source grounded, and a voltage of about 7 V is applied to the drain. At this time, a large current flows between the drain and the source, whereby hot electrons of a high energy generated around the drain junction are injected into the floating gate and accumulated in the floating gate. The memory cell transistor to which data is written has a high threshold voltage, thereby storing therein data "0", for example.

To erase data stored in the memory cell transistor, on the other hand, a high voltage of about 12 V is applied to the source with the control gate (positive gate type) grounded. At this time, a high-intensity electric field is generated between the floating gate and the source, and the electrons accumulated in the floating gate are drawn through the thin silicon oxide film by a tunnel current. Therefore, the threshold of the memory cell transistor is reduced, so that the data stored therein is erased.

In the memory cell transistor of FIG. 10, the data writing is performed on the drain junction side, and the data erasing is performed on the source junction side. In a device design, the junction profile is optimized in accordance with the operations on the drain junction side and the source junction side. More specifically, an electric-field-concentration type profile involving an abrupt change in the impurity concentration is employed on the drain junction side to increase the writing efficiency, while an electric-field-dispersion type profile involving a stepwise change in the impurity concentration is employed on the source junction side to allow the application of a high-intensity electric field for data erasing. Therefore, the construction is asymmetrical on the drain junction side and on the source junction side.

In a method for reducing a voltage to be applied to the source for data erasing, a negative voltage is applied to the control gate (negative gate type).

In the memory cell transistor of FIG. 10, the ion concentration around a channel inversion layer is rendered substantially uniform by implanting ions of the same conductivity type as that of the semiconductor substrate 21 before the formation of the floating gate 23. If the impurity concentration in the channel inversion layer is uniformly increased along the length of the channel, the efficiency of hot electron injection into the floating gate for data writing is increased, that is, the time required for the data writing can be shortened. When electrons are drawn out of the floating gate to the source for data erasing, however, a band-to-band tunneling current increases causing increase in current consumption. In addition, hot holes thereby generated migrate into the tunnel oxide film, so that hot hole behavior becomes less reliable for channel operation.

On the other hand, if the impurity concentration in the channel inversion layer is uniformly reduced along the length of the channel, the band-to-band tunneling current can be reduced, but the efficiency of data writing is reduced. Therefore, a tradeoff between the writing characteristics and the erasing characteristics is a critical problem.

To solve this problem, a memory cell transistor is proposed in which the impurity concentrations in a portion adjacent to a source region and in a portion adjacent to a drain region are independently optimized by implanting ions of the same conductivity type as that of a semiconductor substrate only into the portion adjacent to the drain region after the aforesaid process steps for memory cell transistor fabrication are performed.

However, the fabrication process for such a memory cell transistor requires an additional mask for ion implantation for the optimization of the impurity concentration in the portion adjacent to the drain region. In addition, the fabrication process requires a resist application step, an exposure step, a developing step, a removal step and an impurity-diffusion-layer formation step. Thus, the process is complicated, resulting in a reduced throughput.

One exemplary fabrication process for a memory cell transistor having source/drain regions of an asymmetrical structure is disclosed in Japanese Unexamined Patent Publication No. 4-329632 (1992). As shown in FIG. 11, gate electrodes 33 formed on a first region A of a semiconductor substrate 31 are spaced from each other a predetermined distance, and gate electrodes 33 on a second region B of the semiconductor substrate 31 are spaced from each other a distance smaller than that in the first region A. Ions are implanted into the first and second regions A and B at an ion implantation angle $\theta_1$ ($0°<\theta_1<90°$) with respect to a normal line to the semiconductor substrate 31 by oblique rotation ion implantation to form source/drain regions 34A in the first region A and source/drain regions 34B in the second region B respectively having different ion concentrations.

Another exemplary fabrication process is disclosed in Japanese Unexamined Patent Publication No. 6-21476 (1994). As shown in FIGS. 12(a) to 12(d), P-type ions are implanted from the side of a drain (FIG. 12(b)) and N-type ions are implanted from the side of a source (FIG. 12(c)) at an ion implantation angle $\theta_2$ ($0°<\theta_2<90°$).

However, the aforesaid ion implantation methods cannot be applied to a NOR-type flash EEPROM such as of FIG. 10 having a common source region shared with adjacent memory cells, because ions to be selectively implanted into the drain region are also implanted into the source region, making it impossible to form a desired flash EEPROM of the asymmetrical structure.

SUMMARY OF THE INVENTION

In accordance with one aspect of the present invention, there is provided a semiconductor memory device comprising: a plurality of memory cell transistors each having a tunnel oxide film formed on a semiconductor substrate of a first conductivity type, a floating gate formed on the tunnel oxide film, a control gate overlaid on the floating gate with intervention of an insulating film, source/drain regions of a second conductivity type formed in the semiconductor substrate, and a high-concentration impurity layer of the first conductivity type formed in a portion adjacent to the drain region below the floating gate by oblique ion implantation employing an implantation angle $\theta$ with respect to a normal line to the semiconductor substrate; the plurality of memory cell transistors each sharing a source region with a memory cell transistor disposed adjacent thereto on one side thereof and a drain region with a memory cell transistor disposed adjacent thereto on the other side thereof; the implantation angle $\theta$ being defined by the following expression:

$0<\tan^{-1}(Ld/Hg)<\theta<\tan^{-1}(Ls/Hg)<\pi/2$ wherein Ls is a distance between gates of the adjacent transistors sharing the source region, Ld is a distance between gates of the adjacent transistors sharing the drain region, and Hg is a total height of at least the floating gate, the insulating film and the control gate on the tunnel oxide film.

In accordance with another aspect of the present invention, there is provided a process for fabricating a semiconductor memory device as described above, comprising the steps of: (i) defining a device formation region on a semiconductor substrate of a first conductivity type, and forming a tunnel oxide film, a floating gate in this order, an insulating film and a control gate; (ii) performing a first oblique ion implantation employing an ion implantation angle of $\theta°$ with respect to a normal line to the semiconductor substrate and a second oblique ion implantation employing an ion implantation angle of $-\theta°$, using the floating gate and the control gate as a mask, to form a high-concentration impurity layer of the first conductivity type in a portion adjacent to a drain region below the floating gate, the angle $\theta$ being defined by the following expression:

$0<\tan^{-1}(Ld/Hg)<\theta<\tan^{-1}(Ls/Hg)<\pi/2$; and (iii) implanting ions into the semiconductor substrate from a direction generally normal to the semiconductor substrate by using the floating gate and the control gate as a mask to form source/drain regions of a second conductivity type.

In view of the foregoing, the present invention provides a semiconductor device including flash EEPROM cell transistors of the asymmetrical structure having an optimized junction profile, and a fabrication process therefor including simplified process steps.

DETAILED DESCRIPTION OF THE PREFERRED EMBODIMENTS

Figure 1:
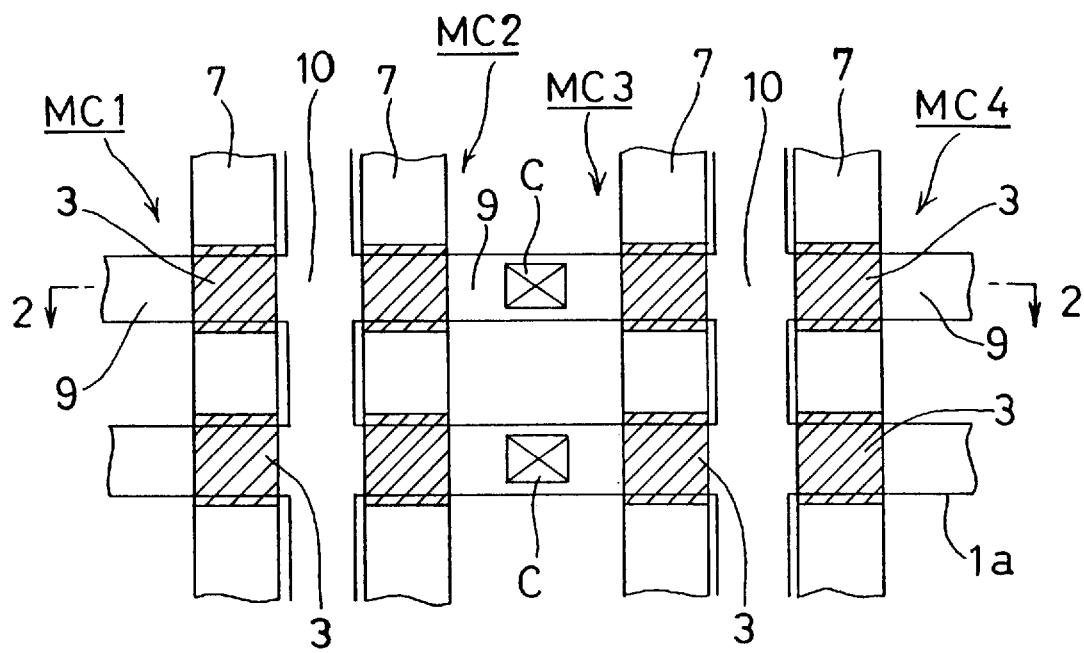
FIG. 1 is a schematic plan view illustrating a semiconductor memory device according to the present invention.

The semiconductor memory device of the present invention, serving as a nonvolatile memory capable of electrically writing and erasing data, comprises a plurality of memory cell transistors (one-transistor-per- cell structure) each sharing a source region with a memory cell transistor disposed adjacent thereto on one side thereof and a drain region with a memory cell transistor disposed adjacent thereto on the other side thereof. The memory cell transistors each include a semiconductor substrate of a first conductivity type, a tunnel oxide film, a floating gate, an insulating film, a control gate, and source/drain regions of a second conductivity type. A high-concentration impurity layer of the first conductivity type is formed in a portion adjacent to the drain region below the floating gate. An insulating spacer may be formed on the control gate as required.

Preferably used as the semiconductor substrate is, for example, a silicon substrate. Preferably used as the tunnel oxide film is a silicon oxide film having a thickness of about 70 Å to about 140 Å. The floating gate is not particularly limited, but a polysilicon film having a thickness of about 1,000 Å to about 2,000 Å is preferably used. Examples of the insulating film include a silicon oxide film and a silicon nitride film and lamination of these films, and the thickness thereof is preferably about 100 Å to about 250 Å. Where an ONO film is employed, the film preferably comprises lamination of an HTO film or a thermal oxide film having a thickness of about 20 Å to about 100 Å, a silicon nitride film having a thickness of about 50 Å to about 150 Å, and another HOT film or a thermal oxide film having a thickness of about 50 Å to about 150 Å. The control gate also functioning as a word line is not particularly limited, but may be formed of polysilicon, a high-melting-point metal such as W, Ta or Ti, a silicide or polycide of any of these metals, or the like in a thickness of about 2,000 Å to about 5,000 Å. Among these, the most preferable is lamination consisting of a polysilicon film having a thickness of about 1,000 Å to about 2,000 Å and a tungsten silicide film having a thickness of about 1,000 Å to about 3,000 Å. The source/drain regions preferably contain impurity ions of the second conductivity type in a concentration of $1\times10^{19}$ ions/cm$^3$ to $9\times10^{20}$ ions/cm$^3$ which corresponds to a dose of about $1\times10^{15}$ ions/cm$^2$ to about $1\times10^{16}$ ions/cm$^2$. Where the insulating spacer is formed, the thickness thereof is not limited, and the film is preferably formed of SiN, SiO$_2$ or the like.

In the memory cell transistor, the high-concentration impurity layer is formed in the portion adjacent to the drain region below the floating gate. In other words, for the high-concentration impurity layer, a portion of the channel region adjacent to the drain region has a high concentration of the first conductivity type impurity. The high-concentration impurity layer has a depth equivalent to or smaller than that of the drain region. The portion of the channel region adjacent to the drain region preferably has an impurity concentration of about $5\times10^{16}$ ions/cm$^3$ to about $1\times10^{18}$ ions/cm$^3$.

Figure 6:
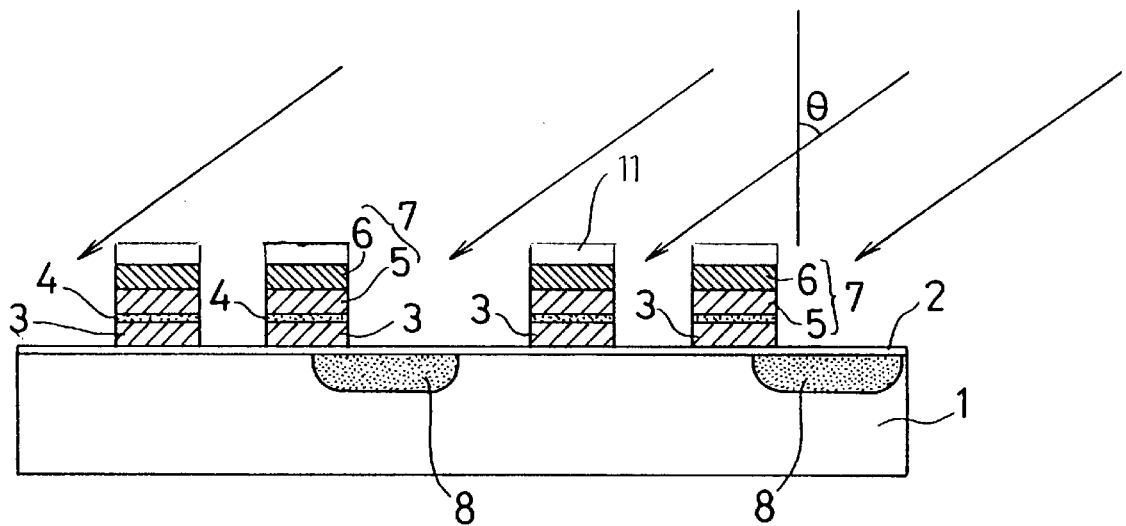
FIGS. 6 and 7 are schematic sectional views for explaining a fabrication process for still another semiconductor memory device.

The high-concentration impurity layer is formed by oblique ion implantation employing an implantation angle θ with respect to a normal line to the semiconductor substrate, which will later be detailed in a description for the fabrication process. The implantation angle θ is herein defined as follows:

$0<\tan^{-1}(Ld/Hg)<\theta<\tan^{-1}(Ls/Hg)<\pi/2$ wherein Ls is a distance between gates of adjacent transistors sharing a source region, Ld is a distance between gates of adjacent transistors sharing a drain region, and Hg is a total height of the floating gate, the insulating film and the control gate (where the insulating spacer is formed, Hg is a total height of the floating gate, the insulating film, the control gate and the insulating film spacer as shown in FIG. 6). The high-concentration impurity layer is not formed in a portion adjacent to the source region, but only in the portion adjacent to the drain region.

Values of Ls, Ld and Hg are appropriately controlled depending on the size and integration level of a semiconductor memory device to be fabricated. In accordance with 0.4 μm to 0.6 μm design rules, it is preferred that Ls is about 0.3 μm to about 0.7 μm, Ld is about 0.8 μm to about 1.8 μm, and Hg is about 3,000 Å to about 10,000 Å. Accordingly, the angle θ is preferably about 25° to about 73°.

In accordance with the present invention, the portion adjacent to the source region or a peripheral portion of the source region may have an electric-field-dispersion type profile involving a stepwise change in the impurity concentration to disperse an electric field on the side of the source region. More specifically, a low-concentration impurity layer having a lower impurity concentration than the source region may be formed in a portion adjacent to the source region on the side of the channel region or, alternatively, in the entire peripheral portion of the source region. The impurity concentration in the low-concentration impurity layer is appropriately controlled by the impurity concentration in the semiconductor substrate, the impurity concentration in the source region and the like. The impurity concentration and depth of the low-concentration impurity layer is preferably controlled to provide such a junction profile as to suppress a bulk-source junction breakage and band-to-band tunneling on the substrate surface when a high voltage is applied to the source region for data erasing.

In the process for fabricating a semiconductor memory device according to the present invention, a device forma-tion region is defined on a semiconductor substrate of a first conductivity type, and a tunnel oxide film, a floating gate, an insulating film and a control gate are formed thereon in the step (i). The definition of the device formation region is achieved by forming, for example, an LOCOS film for device isolation. The tunnel oxide film is formed in a desired thickness by a known thermal oxidation or the like. For the formation of the floating gate, a polysilicon film is first formed by a known method and patterned to a width corresponding to a line width of the floating gate. Thereafter, an insulating film material and a control gate material are deposited on the resulting substrate by a known method, and sequentially patterned by a photolithographic and etching process to simultaneously form the insulating film and the control gate.

After the device formation region is defined, a sacrificial oxide film having a thickness of about 100 Å to about 500 Å is first formed on the resulting substrate, and then impurity ions of the first conductivity type are implanted into the entire device formation region in a dose of about $1\times10^{12}$ ions/cm$^2$ to about $5\times10^{13}$ ions/cm$^2$ at an implantation energy of about 30 keV to about 250 keV. Thus, the impurity concentration in a portion of the semiconductor substrate adjacent to a source region below the floating gate can be optimized in a completed semiconductor memory device. The sacrificial oxide film may be thereafter removed by a known method using, for example, wet etching process using a hydrofluoric acid, and then the tunnel oxide film may newly be formed.

In the step (ii), a first oblique ion implantation process is performed by using the floating gate and the control gate as a mask, which employs an implantation angle of θ° with respect to a normal line to the semiconductor substrate, and a second oblique ion implantation process is performed which employs an implantation angle of –θ°, the angle θ being defined as follows:

$0<\tan^{-1}(Ld/Hg)<\theta<\tan^{-1}(Ls/Hg)<\pi/2$

At this time, impurity ions are preferably implanted in a dose of about $1\times10^{12}$ ions/cm$^2$ to about $1\times10^{13}$ ions/cm$^2$ at an implantation energy of about 40 keV to about 150 keV. The first and second oblique ion implantation processes preferably employ the same dose and the same implantation energy, but may employ different doses and different implantation energies. These two oblique ion implantation processes make it possible to form a high-concentration impurity layer of the first conductivity type only in a desired portion adjacent to a drain formation region below the floating gate without defining the ion implantation region by using a resist mask or the like. Where these oblique ion implantation processes employ a predetermined dose, a predetermined energy and a predetermined implantation direction, it is preferred that ions are implanted from one direction in the first oblique ion implantation process and then from another direction in the second oblique ion implantation process. Alternatively, the first and second ion implantation processes may be performed simultaneously, or may be alternately performed in a sequential manner while the semiconductor substrate is rotated around the normal line to the substrate.

In the step (iii), ions are implanted from a direction normal to the semiconductor substrate by using the floating gate and the control gate as a mask to form source/drain regions of a second conductivity type. The ion implantation process preferably employs a dose of about $2\times10^{15}$ ions/cm$^2$ to about $1\times10^{16}$ ions/cm$^2$ and an implantation energy of about 15 keV to about 40 keV.

Before the formation of the source/drain regions, a low-concentration impurity layer having a lower impurity concentration than the source region may be formed in the entire peripheral portion of the source formation region or in a portion adjacent to the source formation region below the floating gate by performing ion implantation which uses a resist pattern having an opening only on the source formation region. At this time, impurity ions are preferably implanted in a dose of about $1\times10^{14}$ ions/cm$^2$ to about $1\times10^{15}$ ions/cm$^2$ at an implantation energy of about 10 keV to about 40 keV. The formation of the low-concentration impurity layer in the portion adjacent to the source formation region may otherwise be achieved by the same method as for formation of an LDD by using a side wall spacer or the like.

With reference to the attached drawings, there will hereinafter be described flash memories which are exemplary semiconductor memory devices according to the present invention, and fabrication processes therefor.

Embodiment 1: Positive-gate type memory cell transistors

Figure 2:
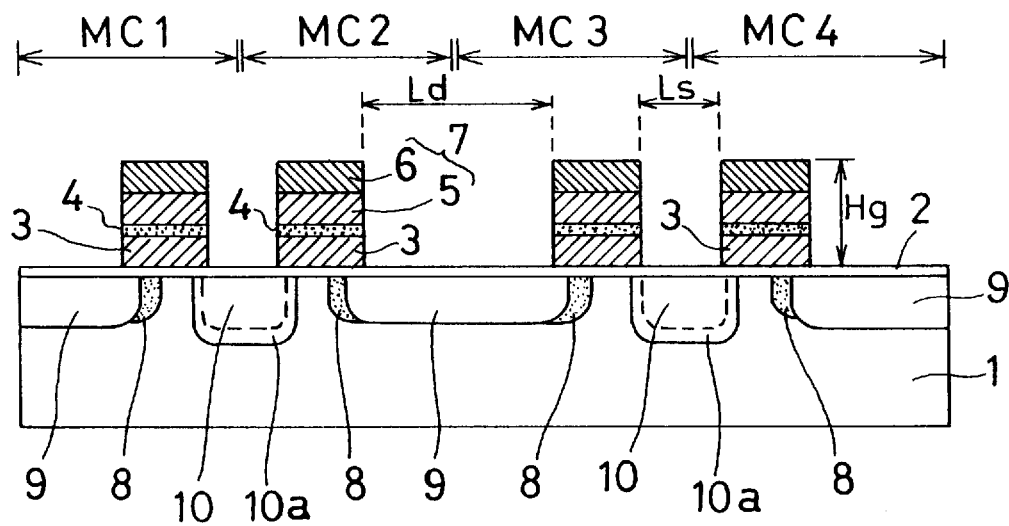
FIG. 2 is a sectional view taken along a line 2—2 in FIG. 1.

A flash memory according to the present invention includes a plurality of memory cell transistors disposed in a matrix and each constituting a memory cell, as shown in FIGS. 1 and 2. The memory cell transistors each have a floating gate 3 of a polysilicon film formed on a silicon substrate 1 with intervention of a tunnel oxide film 2, an ONO film 4 serving as an insulating film, and a control gate 7 comprised of a polysilicon film 5 and a tungsten silicide film 4 and also functioning as a word line. The memory cell transistors each further includes a source region 10 and a drain region 9 on opposite sides of the floating gate 3 and the control gate 7. The source region 10 has a low-concentration impurity layer 10a having a relatively low impurity concentration in its peripheral portion. A high-concentration impurity layer 8 of the same conductivity type as the silicon substrate 1 is formed in a portion adjacent to the drain region below the floating gate 3.

The transistors each share the source region 10 with a transistor disposed adjacent thereto on one side thereto with their gates spaced a distance Ls, and shares the drain region 9 with a transistor disposed adjacent thereto on the other side thereof with their gates spaced a distance Ld. The floating gate 3, the ONO film 4 and the control gate 7 on the tunnel oxide film 2 have a total height Hg. The height Hg may be adjusted by providing a height adjusting layer 11 such as of an insulating film on the control gate 7.

An explanation will next be given to a process for fabricating a flash memory as described above.

A device formation region 1a is defined on a P-type silicon substrate 1 by forming an LOCOS film (not shown) thereon, and then the entire surface of the silicon substrate 1 is covered with a sacrificial oxide film (not shown). In turn, P-type ions are implanted into the device formation region 1a. The conditions for the ion implantation are controlled so as to optimize the impurity concentration in a portion of a channel region adjacent to a source formation region in a memory cell.

Thereafter the sacrificial oxide film is removed, and then a tunnel oxide film 2 is formed on the entire surface of the silicon substrate 1.

Subsequently, polysilicon is deposited on the resulting substrate and patterned into a desired configuration by a photolithographic and etching process to form a first polysilicon film having a width corresponding to a line width of a floating gate which will be formed in the subsequent step. In turn, an ONO film 4 comprised of a silicon oxide film, a silicon nitride film and another silicon oxide film, a second polysilicon film 5 and a tungsten silicide film 6 are sequentially formed on the first polysilicon film. An insulating film may optionally be formed thereon. Thereafter, a resist pattern having a desired configuration is formed by a photolithographic process, and then the tungsten silicide film 6, the second polysilicon film 5, the ONO film 4, the first polysilicon film and, if the insulating film is present, an insulating film spacer 11 are patterned into a desired configuration by using the resist pattern as a mask to form floating gates 3 and control gates 7 also functioning as word lines. At this time, one gate set consisting of a floating gate 3, an ONO film 4 and a control gate 7 in one memory cell (MC2 or MC4) is spaced by a distance Ls (see FIG. 2) corresponding to a length of a source region from another gate set in another memory cell (MC1 or MC3) disposed adjacent thereto on one side thereof, so that the memory cell MC2 or MC4 shares the source region with the transistor MC1 or MC3. Further, one gate set in one memory cell (MC2) is spaced by a distance Ld (see FIG. 2) corresponding to a length of a drain region from another gate set in another memory cell (MC3) disposed adjacent thereto on the other side thereof, so that the memory cell MC2 shares the drain region with the memory cell MC3.

Figure 3:
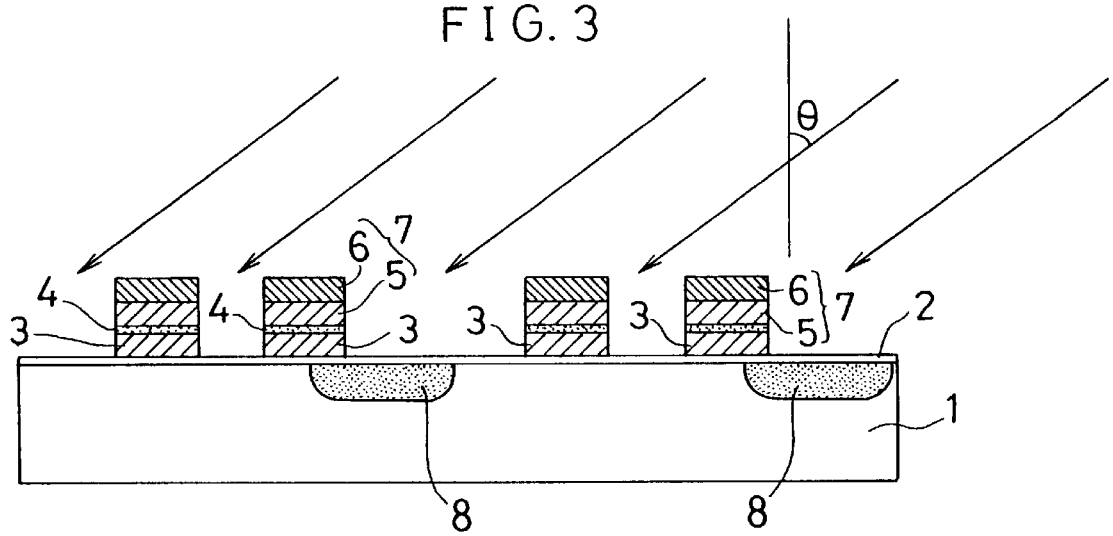
FIGS. 3 and 4 are schematic sectional views for explaining a fabrication process for the semiconductor memory device of FIG. 2.

After the resist pattern is removed, a first oblique ion implantation process is performed in which P-type ions such as boron ions are implanted into the resulting substrate at an implantation angle θ with respect to a normal line to the substrate by using the floating gates 3 and the control gates 7 as a mask, as shown in FIG. 3 (or in FIG. 6, where the insulating film spacer 11 is formed).

Figure 4:
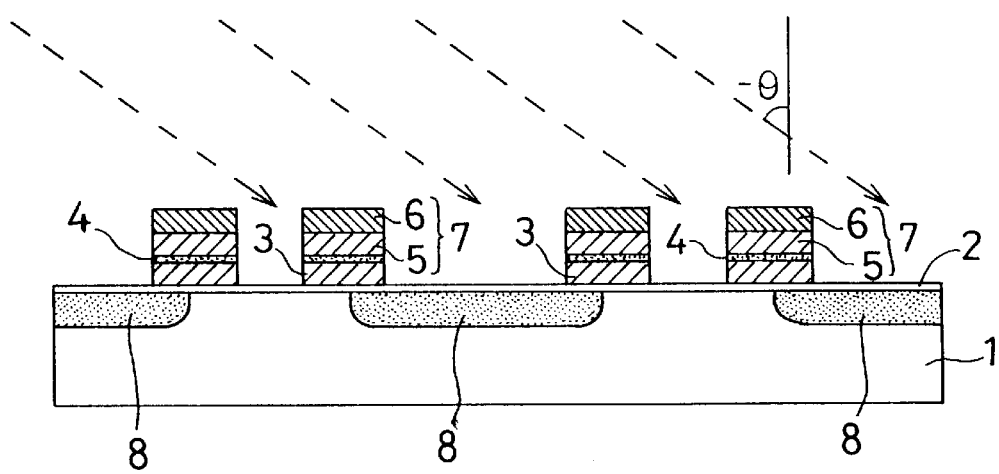
Figure 7:
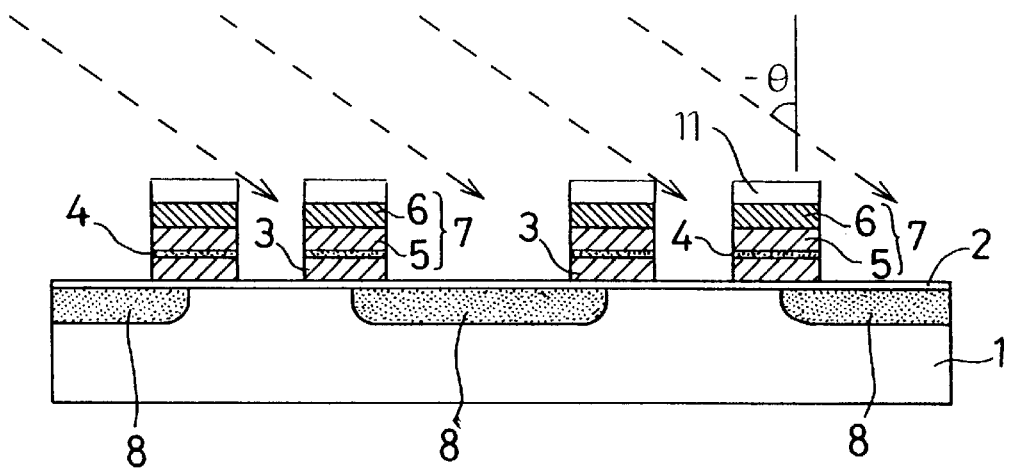
Figure 8:
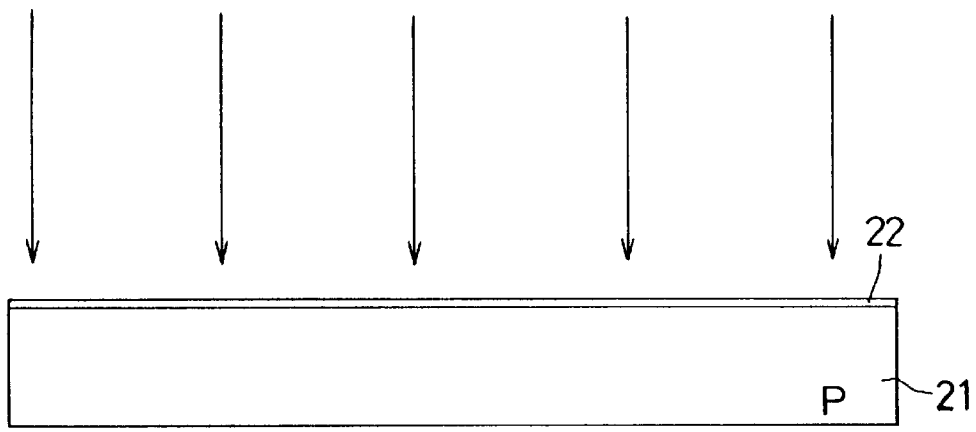
FIGS. 8 to 10 are schematic sectional views for explaining a fabrication process for a conventional semiconductor memory device.
Figure 9:
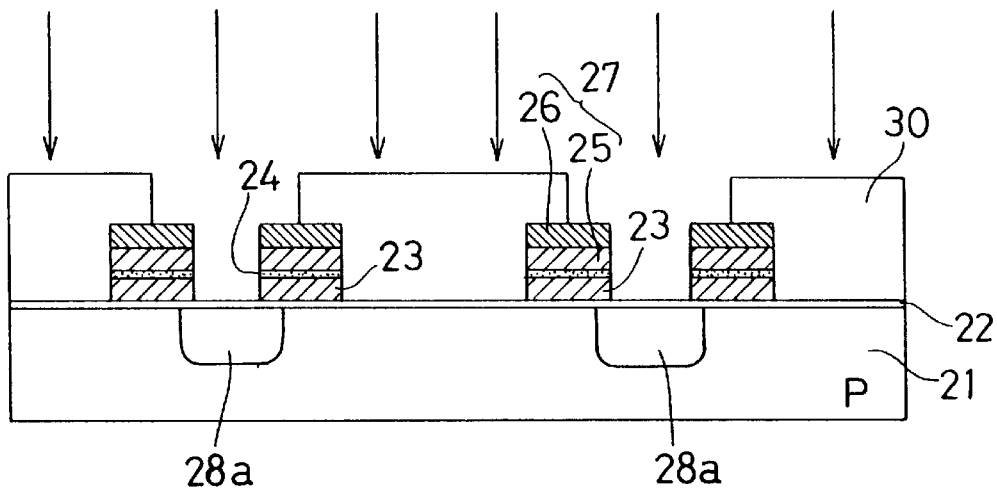
Figure 10:
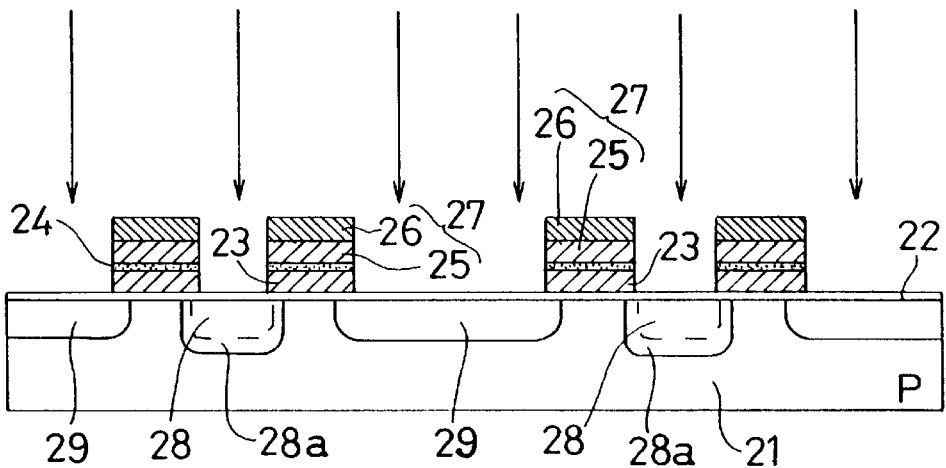
Figure 11:
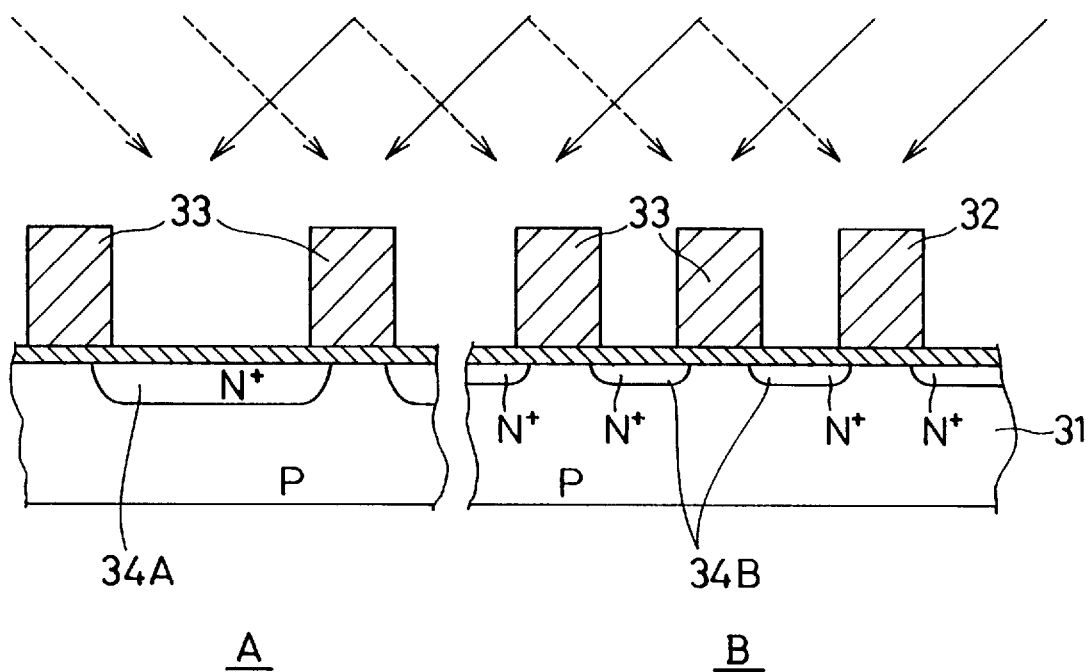
FIG. 11 is a schematic sectional view for explaining a fabrication process for another conventional semiconductor memory device.
Figure 12A:
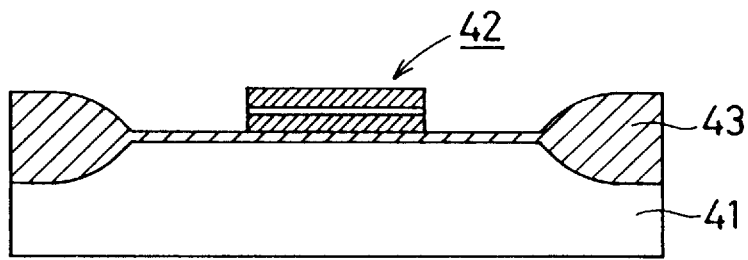
FIGS. 12(a) to 12(d) are schematic sectional views for explaining a fabrication process for still another conventional semiconductor memory device.
Figure 12B:
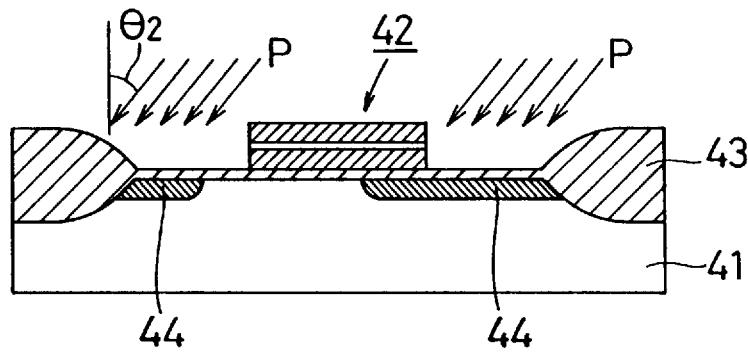
Figure 12C:
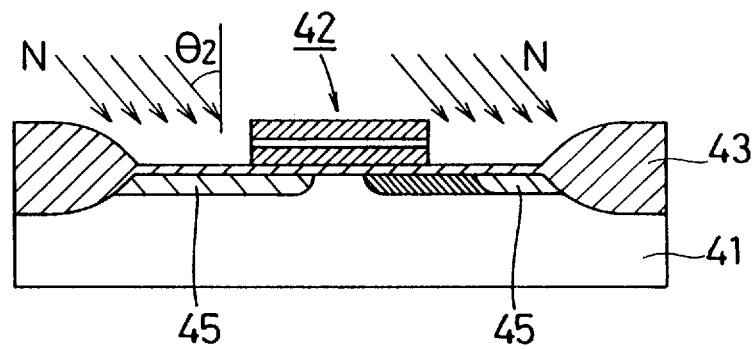
Figure 12D:
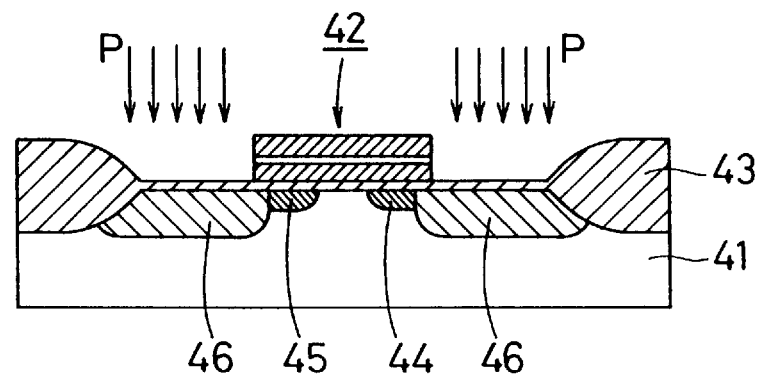

In turn, as shown in FIG. 4 (or in FIG. 7, where the insulating film spacer 11 is formed), a second oblique ion implantation process is performed in which ions of the same conductivity type as in the first oblique ion implantation process are implanted into the substrate at an implantation angle of −θ° with respect to the normal line by using the floating gates 3 and the control gates 7 as a mask and employing the same dose and energy as in the first oblique ion implantation process.

These two ion implantation processes allow a P-type high-concentration impurity layer 8 to be formed only in a portion adjacent to a drain formation region below the floating gate 3. Since the distance Ld between the gates of adjacent cells sharing the drain region is greater than the distance Ls between the gates of adjacent cells sharing the source region, the implantation angles of θ° and −θ° are appropriately determined such that the ions to be implanted for the formation of the drain region are prevented from being implanted into the source formation region.

In turn, a resist pattern having an opening only on the source formation region is formed on the resulting substrate by a photolithographic and etching process, and N-type ions such as phosphorus ions or arsenic ions are implanted into the silicon substrate 1 from a direction perpendicular to the surface of the substrate to form a low-concentration impurity layer 10a in a peripheral portion of the source formation region.

After the resist pattern is removed, arsenic ions are implanted into the silicon substrate 1 from a direction generally perpendicular to the surface of the substrate by using the floating gates 3 and the control gates 7 as a mask. Thus, positive-gate type memory cell transistors each having the source region 10 and the drain region 9 as shown in FIG. 2 are fabricated.

Embodiment 2: Negative-gate type memory cell transistors

Figure 5:
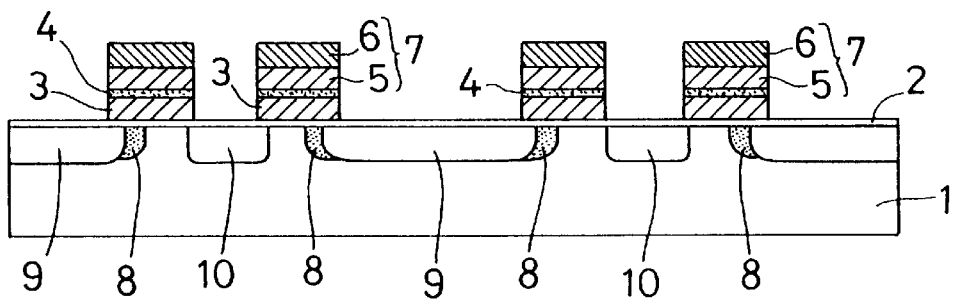
FIG. 5 is a schematic sectional view illustrating another semiconductor memory device according to the present invention.

A flash memory according to Embodiment 2 has substantially the same construction as the memory cell transistor shown in FIGS. 1 and 2, except that the low-concentration impurity layer 10a having a relatively low impurity concentration is not formed in the peripheral portion of the source region 10, as shown in FIG. 5.

The flash memory is fabricated in the following manner.

As shown in FIGS. 3 and 4, tunnel oxide films 2, floating gates 3, ONO films 4, control gates 7 and P-type impurity layers 8 having a high impurity concentration are formed on a P-type silicon substrate 1 in the same manner as in Embodiment 1.

In turn, N-type ions such as arsenic ions are implanted into the silicon substrate 1 from a direction perpendicular to the surface of the silicon substrate 1 by using the floating gates 3 and the control gates 7 as a mask. Thus, negative-gate type memory cell transistors each having a source region 10 and a drain region 9 are fabricated as shown in FIG. 5.

According to the semiconductor memory device, the high-concentration impurity region of the first conductivity type is formed only in the portion adjacent to the drain region, thereby providing a steep concentration gradient between the source and the drain. This facilitates the acceleration of electrons for data writing, so that the electrons are more readily attracted to the floating gate. Therefore, the efficiency of hot electron injection into the floating gate can be increased to shorten the time required for the data writing. Since the concentration of the impurity of the first conductivity type in the portion adjacent to the source region is low, electrons can readily be drawn out of the floating gate to the source for the data erasing. This decreases the band-to-band tunneling current, thereby reducing the power consumption.

Where the low-concentration impurity layer of the second conductivity type is formed in the peripheral portion of the source region or in the portion adjacent to the source region below the floating gate, the concentration gradient between the source and the drain can be increased. Therefore, electrons can readily be drawn out of the floating gate to the source for the data erasing. This decreases the band-to-band tunneling current, thereby reducing the power consumption.

In the process for fabricating a semiconductor memory device according to the present invention, the first oblique ion implantation process employs an implantation angle of $\theta°$ and the second oblique ion implantation process employs an ion implantation angle of $-\theta°$, the angle $\theta$ being defined by the following expression:

$0<\tan^{-1}(Ld/Hg)<\theta<\tan^{-1}(Ls/Hg)<\pi/2$

Therefore, the fabrication process does not require process steps for additional ion implantation into the drain region including a resist application step, a light exposure step, a developing step and a removal step. Thus, the fabrication process is simplified.

What is claimed is:

1. A process for fabricating a semiconductor memory device comprising the steps of:

(i) defining a device formation region comprising a plurality of memory cell transistor on a semiconductor substrate of a first conductivity type, and forming a tunnel oxide film, a floating gate, an insulating film and a control gate in this order; wherein the plurality of memory cell transistors share a source region with a memory cell transistor disposed adjacent thereto on one side thereof and a drain region with a memory cell transistor disposed adjacent thereto on the other side thereof;

(ii) performing a first oblique ion implantation process employing an ion implantation angle of $\theta$ with respect to a normal line to the semiconductor substrate and a second oblique ion implantation employing an ion implantation angle of $-\theta°$, using the floating gate and the control gate as a mask, to form a high-concentration impurity layer of the first conductivity type in a portion adjacent to a drain formation region below the floating gate, the angle $\theta$ being defined by the following expression:

$0<\tan^{-1}(Ld/Hg)<\theta<\tan^{-1}(Ls/Hg)<\pi/2$ wherein Ls is a distance between gates of the adjacent transistors sharing the source region, Ld is a distance between gates of the adjacent transistors sharing the drain region, and Hg is a total height of at least the floating gate, the insulating film and the control gate on the tunnel oxide film; and iii) implanting ions into the semiconductor substrate from a direction generally normal to the semiconductor substrate by using the floating gate and the control gate as a mask to form source/drain regions of a second conductivity type.

2. A process as set forth in claim 1, wherein an impurity of the first conductivity type is implanted into the entire device formation region to optimize an impurity concentration in a portion adjacent to the source region below the floating gate in the semiconductor substrate in the step (i).

3. A process as set forth in claim 1, wherein a resist pattern having an opening only on a source formation region is formed before the formation of the source/drain regions, and ions are implanted from a direction normal to the semiconductor substrate by using the resist pattern as a mask to form a low-concentration impurity layer of the second conductivity type in a peripheral portion of the source formation region or in a portion adjacent to the source formation region below the floating gate in the step (iii).

4. A process as set forth in claim 1, wherein an insulating film spacer is formed on the control gate in the step (i), and the height Hg in the step (ii) is a total height of the floating gate, the insulating film, the control gate and the insulating spacer.

* * * * *